(12) United States Patent
Ito et al.

(10) Patent No.: US 10,752,078 B2
(45) Date of Patent: Aug. 25, 2020

(54) HEAT TRANSFER DEVICE

(71) Applicant: DENSO CORPORATION, Kariya, Aichi-pref. (JP)

(72) Inventors: Koji Ito, Kariya (JP); Koichi Ito, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 626 days.

(21) Appl. No.: 15/101,053

(22) PCT Filed: Nov. 26, 2014

(86) PCT No.: PCT/JP2014/005899
§ 371 (c)(1),
(2) Date: Jun. 2, 2016

(87) PCT Pub. No.: WO2015/083344
PCT Pub. Date: Jun. 11, 2015

(65) Prior Publication Data
US 2017/0001492 A1 Jan. 5, 2017

(30) Foreign Application Priority Data

Dec. 6, 2013 (JP) .................................. 2013-253324

(51) Int. Cl.
*B60H 1/00* (2006.01)
*F28F 21/02* (2006.01)
(Continued)

(52) U.S. Cl.
CPC ..... *B60H 1/00271* (2013.01); *B60H 1/00985* (2013.01); *B60H 1/22* (2013.01);
(Continued)

(58) Field of Classification Search
CPC . F28F 21/02; B60H 1/00271; B60H 1/00985; H01L 23/3733
(Continued)

(56) References Cited

U.S. PATENT DOCUMENTS

| 5,077,637 A | 12/1991 | Martorana et al. |
| 5,316,080 A | 5/1994 | Banks et al. |
| 5,588,300 A | 12/1996 | Larsson et al. |
| 5,769,158 A | 6/1998 | Yao |

(Continued)

FOREIGN PATENT DOCUMENTS

| DE | 60309034 T2 | 4/2007 |
| EP | 1870288 A1 | 12/2007 |

(Continued)

OTHER PUBLICATIONS

Terumitsu Imanishi et al., "Effect of CNT Addition on Thermal Properties of VGCF/Aluminum Composites", The Japan Society of Mechanical Engineers, Jan. 2009, vol. 75, No. 749, p. 27-33.

*Primary Examiner* — Elizabeth J Martin
*Assistant Examiner* — Nael N Babaa
(74) *Attorney, Agent, or Firm* — Harness, Dickey & Pierce, P.L.C.

(57) ABSTRACT

A heat transfer device couples a heat generation member with a heat radiation member, and transfers heat from the heat generation member to the heat radiation member. The heat transfer device includes a composite member and a heat conductor. The composite member includes multiple carbon nanotubes and multiple carbon fibers which are mixed into a base material and complexed together, and the respective carbon fibers are crosslinked with each other by the carbon nanotubes. The heat conductor has one flexible end embedded in the composite member. The embedded one end is crosslinked with the carbon fibers in the composite member through the carbon nanotubes.

19 Claims, 8 Drawing Sheets

(51) Int. Cl.
*H01L 23/373* (2006.01)
*H05K 7/20* (2006.01)
*B60H 1/22* (2006.01)
*B60R 16/02* (2006.01)
*B60H 1/32* (2006.01)
*F28F 13/00* (2006.01)

(52) U.S. Cl.
CPC ......... *B60H 1/3227* (2013.01); *B60R 16/02* (2013.01); *F28F 21/02* (2013.01); *H01L 23/373* (2013.01); *H05K 7/2039* (2013.01); *H05K 7/20418* (2013.01); *B60H 1/2215* (2013.01); *B60H 2001/229* (2013.01); *F28F 2013/001* (2013.01); *F28F 2013/006* (2013.01); *F28F 2255/20* (2013.01); *H01L 2924/0002* (2013.01)

(58) Field of Classification Search
USPC .......................................................... 165/185
See application file for complete search history.

(56) References Cited

U.S. PATENT DOCUMENTS

| | | | |
|---|---|---|---|
| 2007/0160841 | A1 | 7/2007 | Wang et al. |
| 2008/0148755 | A1* | 6/2008 | Fujii ................. B60H 1/00878 62/259.2 |
| 2010/0124025 | A1* | 5/2010 | Yamaguchi ........... H01L 23/373 361/708 |
| 2011/0024694 | A1* | 2/2011 | Shah ........................ C08J 5/042 252/502 |
| 2013/0188319 | A1* | 7/2013 | Yamaguchi ........... H05K 7/2039 361/717 |
| 2014/0221533 | A1 | 8/2014 | Hata et al. |
| 2017/0107416 | A1 | 4/2017 | Hata et al. |

FOREIGN PATENT DOCUMENTS

| | | |
|---|---|---|
| JP | 2010192661 A | 9/2010 |
| JP | 2012109604 A | 6/2012 |
| JP | 2013153089 A | 8/2013 |
| WO | WO-2013051707 A1 | 4/2013 |

* cited by examiner

FIG. 6

| POSITION | COMPOSITE MEMBER | HEAT CONDUCTOR | INTERFACE SUBSTANCE |
|---|---|---|---|
| THERMAL CONDUCTIVITY | $\lambda 6 = 1000 W/mK$ | $\lambda 7 = 1500 W/mK$ | $\lambda 13 = 50 W/mK$ |
| HEAT TRANSFER AREA | $A6 = 100 mm^2$ | $A7 = 38.5 mm^2$ | $A13 = 100 mm^2$ |
| BASIC FORMULA OF HEAT TRANSFER | $\dot{q} = \dfrac{\lambda A}{L}(T_i - T_o)$  $\dot{q}$: HEAT TRANSFER AMOUNT PER UNIT TIME $[W]$  $\lambda$: THERMAL CONDUCTIVITY $[W/mK]$  $A$: HEAT TRANSFER AREA $[m^2]$  $L$: LENGTH $[m]$ | | $T_i = 85\,[°C]$  $T_o = 5\,[°C]$  $\dot{q} = 9\,[W]$ |

FIG. 7

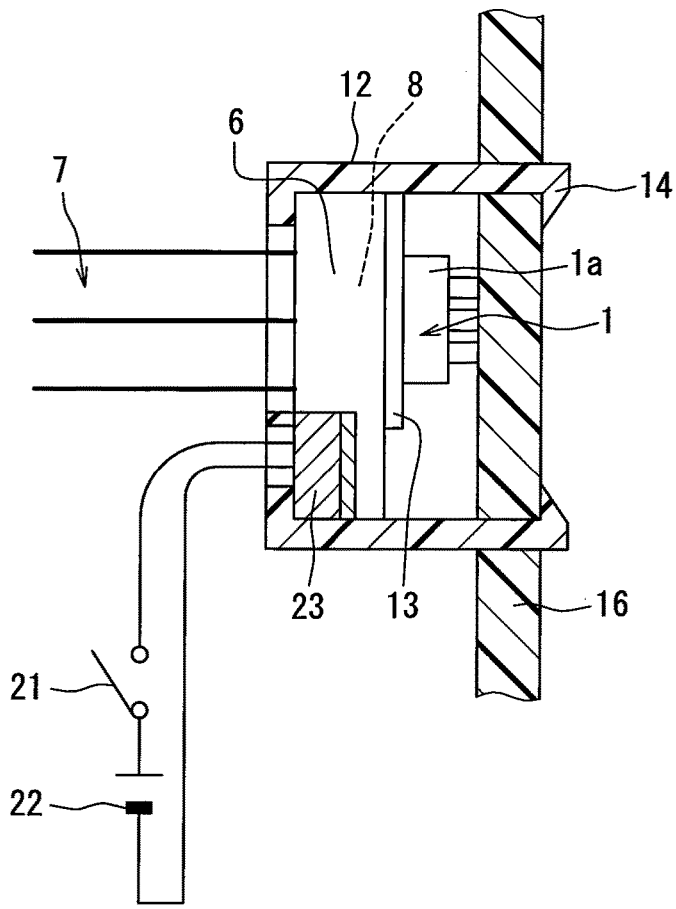

HEAT TRANSFER DEVICE

CROSS REFERENCE TO RELATED APPLICATIONS

This application is a U.S. National Phase Application under 35 U.S.C. 371 of International Application No. PCT/JP2014/005899 filed on Nov. 26, 2014 and published in Japanese as WO 2015/083344 A1 on Jun. 11, 2015. This application is based on and claims the benefit of priority from Japanese Patent Application No. 2013-253324 filed on Dec. 6, 2013. The entire disclosures of all of the above applications are incorporated herein by reference.

TECHNICAL FIELD

The present disclosure relates to a heat transfer device having a heat conductor that can transfer a heat between a heat generation member that is an object to be cooled and a heat radiation member that radiates the heat transferred from the heat generation member. In particular, the present disclosure relates to a heat transfer device that cools an electronic device in a vehicle interior, which serves as the heat generation member placed at a position separate from a vehicle air conditioning apparatus, by using the vehicle air conditioning apparatus.

BACKGROUND ART

In recent vehicles, electronic devices small in size and high in heat generation, such as a navigation apparatus, have been used. Cooling of heat generation units of those electronic devices is becoming increasingly important.

Up to now, a heat radiation component and a manufacturing method for the heat radiation component disclosed in Patent Document 1 have been known. In the disclosed technique, in order to reduce a thermal resistance between a circuit board and a heat sink which radiate a heat, beard-shaped carbon nanotubes (also referred to as "CNT") or carbon fibers are embedded in a metal layer coming in close contact with the heat sink.

Non-Patent Document 1 discloses a technique in which carbon nanotubes are added into a composite of carbon fibers and aluminum, and sintered in plasma, thereby producing an object having a thermal conductivity of three times or more as high as aluminum.

Further, in Non-Patent Document 1, attention is paid to vapor grown carbon fibers (VGCF or simply referred to as the carbon fibers) that exist apart from the other vapor grown carbon fibers without any contacts and do not contribute to heat transfer inside of a composite material of the vapor grown carbon fibers and aluminum. The subject vapor grown carbon fibers and the other vapor grown carbon fibers are crosslinked with carbon nanotubes small in size to improve a thermal conductive characteristic.

In the configuration disclosed in Patent Document 1, the circuit board and the heat sink are adjacent to each other and integrated together, and there is a limit to the mountability and the assembly of those components in a vehicle. Therefore, such a configuration may not be preferable for cooling of the electronic devices dispersed inside of the vehicle. In other words, even if heat generated in semiconductor can be efficiently transferred to the heat sink, the electronic devices have to be cooled by air cooling of the heat sink, individually, and there is a limit to the cooling of the semiconductor associated with a cooling performance of the heat sink.

When the heat sink is upsized, a blower is upsized, or a refrigerant in a refrigeration cycle is introduced, the configuration is increased in size and complicated. As a result, the mountability and the assembly of those components in the vehicle may be lowered. Furthermore, it is conceivable to use a well-known heat pipe as the heat transfer member, but flexibility lacks to struggle against assembly.

In addition, in the technique of Non Patent Document 1, although the thermal conductive characteristic of the composite material of the vapor grown carbon fibers, the carbon nanotubes, and aluminum is improved, there is no disclosure of an improvement in the mountability and the assembling in the vehicle.

PRIOR ART DOCUMENT

Patent Document

Patent Document 1: JP 2010-192661 A

Non-Patent Document

Non-Patent Document 1: Terumitsu Imanishi et al., "Effect of CNT Addition on Thermal Properties of VGCF/Aluminum Composites", Transactions of the JSME, January 2009, Vol. 75, No. 749, pp. 27-33.

SUMMARY OF THE INVENTION

An object of the present disclosure is to provide a heat transfer device that is excellent in a heat transfer characteristic between a heat generation member that is an object to be cooled and a heat radiation member, and is capable of easily coupling the heat generation member with the heat radiation member through a flexible heat conductor.

The contents of the documents listed as prior arts can be introduced or incorporated by reference as a description of technical elements described in the present specification.

According to an aspect of the present disclosure, a heat transfer device includes a heat generation member generating heat, a heat radiation member radiating heat, a heat conductor that has flexibility, thermally couples the heat generation member with the heat radiation member, and transfers heat generated in the heat generation member to the heat radiation member, and a composite member into which an end of the heat conductor is embedded, the composite member being disposed between the end of the heat conductor and at least one of the heat generation member and the heat radiation member, and exchanging heat with the at least one of the heat generation member and the heat radiation member. The composite member includes a base material that exchanges heat with the at least one of the heat generation member and the heat radiation member, and a plurality of carbon nanotubes and a plurality of carbon fibers which are mixed into the base material and complexed with each other. The plurality of carbon fibers are crosslinked with each other by the plurality of carbon nanotubes. The end of the heat conductor is crosslinked with the plurality of carbon fibers in the composite member through the plurality of carbon nanotubes.

According to the above configuration, at least one of the one end and the other end of the flexible heat conductor is embedded into the composite member. The embedded at least one of the one end and the other end is crosslinked with the carbon fibers in the composite member by the carbon nanotubes. Hence, the heat transfer between the heat conductor and the composite member is excellent. Therefore, the heat transfer device, in which the heat transfer characteristic between the heat generation member and the heat radiation member can be improved, and the heat generation member and the heat radiation member can be easily coupled with each other by the flexible heat conductor, can be provided.

The heat conductor may include a carbon fiber cable having a carbon fiber group and a sheet-like graphite made of a carbon-based polymer material. According to the above configuration, one end of the heat conductor having the flexibility is embedded into the composite member, and the embedded one end of the heat conductor is crosslinked with the carbon fibers in the composite member through the carbon nanotubes. In order to obtain the excellent heat transfer characteristic by crosslinking with the carbon fibers in the composite member, the carbon fiber cable or the sheet-like graphite which is the same carbon-based material may be provided.

The composite member may include a heat generation side composite member and a heat radiation side composite member. The heat generation side composite member may exchange heat with the heat generation member, and the heat radiation side composite member may exchange heat with the heat radiation member. The heat generation side composite member and the heat radiation side composite member may be coupled with each other by the heat conductor.

According to the present disclosure, the composite member includes the heat generation side composite member disposed on one side of the heat conductor, and the heat radiation side composite member disposed on the other side of the heat conductor. Hence, one end of the heat conductor is embedded into the heat generation side composite member. In addition, the other end of the heat conductor is embedded into the heat radiation side composite member. Since the embedded heat conductor is crosslinked with the carbon fibers in the respective composite members through the carbon nanotubes, the heat can be efficiently transferred between one composite member and the other composite member.

The fixing member constituting a connector may be coupled with the heat generation member or the heat radiation member by a claw portion or a screw. The heat transfer device may further include an elastic member housed in the fixing member. The elastic member may be compressed in a state where the fixing member is coupled with the heat generation member or the heat radiation member, and may press the base material directly or indirectly on the surface of the heat generation member or the surface of the heat radiation member. According to the above configuration, the base material can be further firmly pressed against the heat generation member or the heat radiation member with a resilient force of the elastic member in addition to a pressure contact caused by the claw portion or the screw, and the heat transfer is improved.

BRIEF DESCRIPTION OF THE DRAWINGS

FIG. 6 is a table showing a characteristic value of each position and a heat transfer amount based on the characteristic value according to the second embodiment.

FIG. 7 is a schematic view illustrating a connector fitted to an electronic device according to a third embodiment of the present disclosure.

EMBODIMENTS FOR EXPLOITATION OF THE INVENTION

Figure 1:
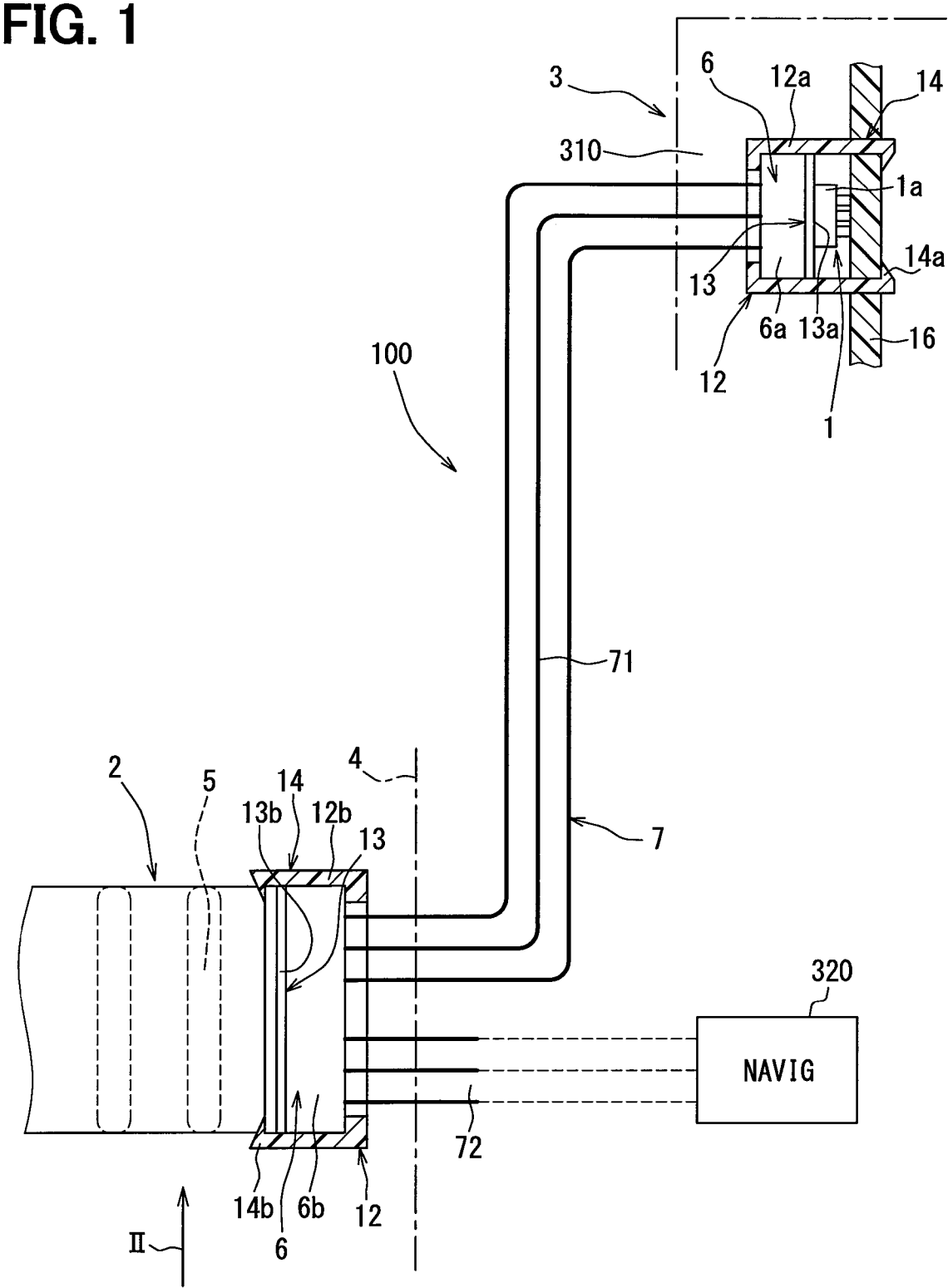
FIG. 1 is a schematic diagram illustrating a heat transfer device according to a first embodiment of the present disclosure.

Hereinafter, multiple embodiments for implementing the present invention will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration.

The parts may be combined if it is explicitly described in each embodiment that the parts can be combined. The embodiments may be partially combined even if it is not explicitly described that the embodiments can be combined, provided there is no harm in the combination.

First Embodiment

Figure 2:
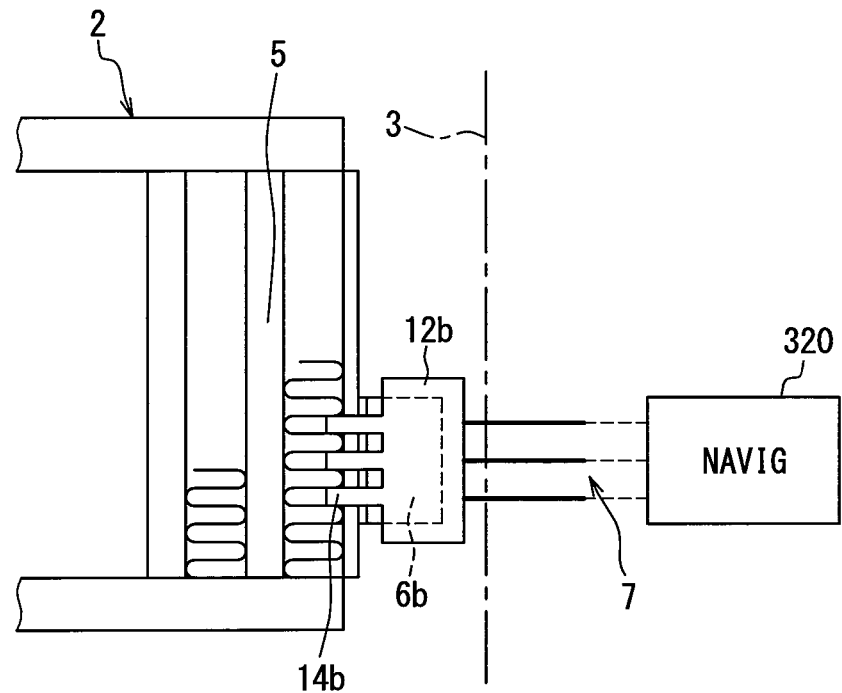
FIG. 2 is a schematic diagram illustrating a part of the heat transfer device viewed in a direction indicated by an arrow II in FIG. 1.
Figure 3:
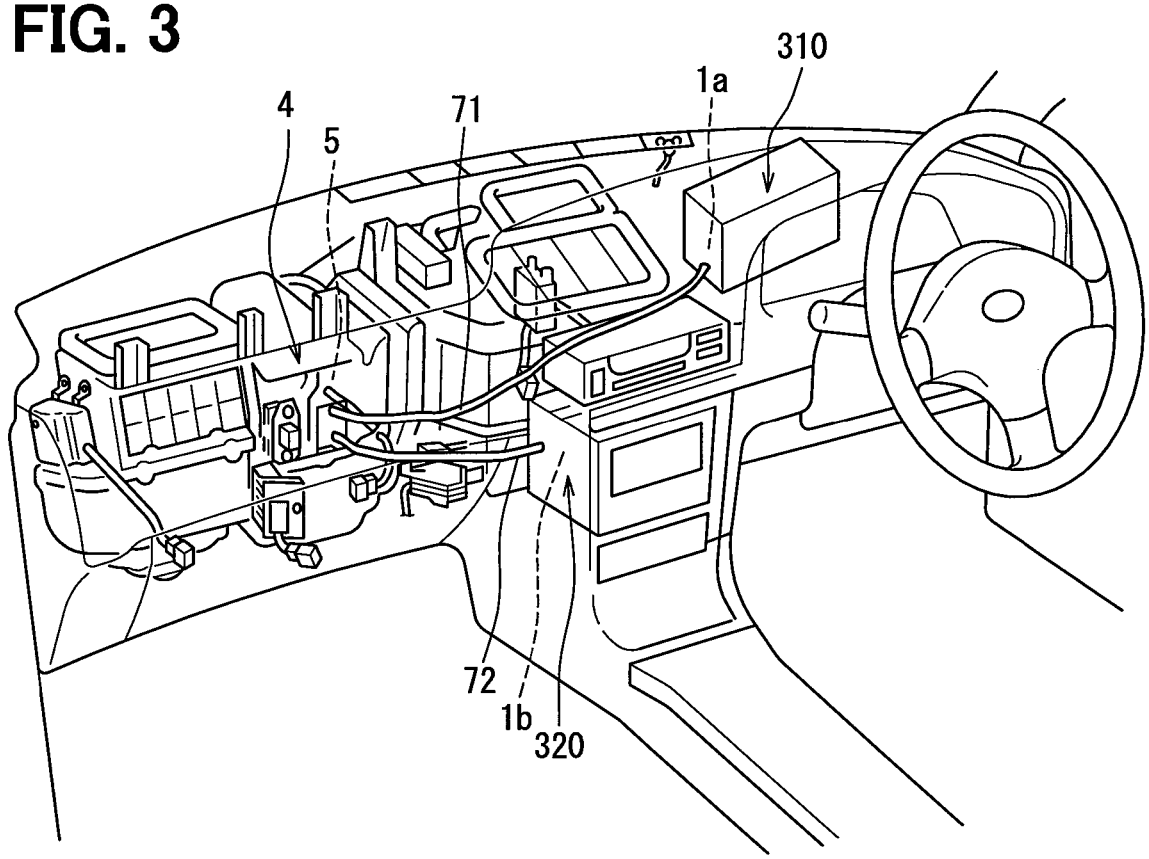
FIG. 3 is a partially transparent view of a neighborhood of an instrument panel in a vehicle in which the heat transfer device is installed according to the first embodiment.

Hereinafter, a first embodiment of the present disclosure will be described in detail with reference to FIG. 1 to FIG. 4. FIG. 1 illustrates a heat transfer device 100 according to a first embodiment of the present disclosure. FIG. 2 illustrates a partial side of the heat transfer device 100 viewed in a direction indicated by an arrow II in FIG. 1. FIG. 3 illustrates a schematic configuration of a neighborhood of an instrument panel in a vehicle in which the heat transfer device 100 is installed.

Referring to FIGS. 1 and 2, a heat generation member 1 that generates heat is formed of a semiconductor device in a head-up display 310 serving as an electronic device 3 in a vehicle interior. A heat radiation member 2 that radiates the heat is formed of an evaporator 5 in a vehicle air conditioning apparatus 4. The evaporator 5 configures a single heat radiation member 2 for multiple heat generation members 1. Another heat generation member 1 is formed of a semiconductor device in a navigation apparatus 320 in FIG. 3 provided inside an instrument panel. Those semiconductor devices are implemented on a circuit board 16 through connection bumps.

With the above configuration, the heat generation member 1 and the heat radiation member 2 are coupled with each other by a one-side composite member 6a (heat generation side composite member) and the other-side composite member 6b (heat radiation side composite member) (also referred to simply as "composite member 6", "composite member 6a", and "composite member 6b"), and multiple heat conductors 71, 72 (also referred to simply as "heat conductors 7"). The heat from the multiple heat generation members 1 is transferred to the single heat radiation member 2. The multiple composite members 6 are fitted in the navigation apparatus 320 and the head-up display 310 which are the heat generation members 1 (1a and 1b).

FIG. 3 illustrates the heat conductors 7 (71, 72) of the heat transfer device 100 fitted in front of a driver's seat and a passenger's seat in the vehicle. Referring to FIG. 3, a pair of heat conductors 71 is connected to the evaporator 5 in an air conditioning case of the vehicle air conditioning apparatus 4 and the head-up display 310. Another pair of heat conductors 72 is connected to the evaporator 5 and the navigation apparatus 320.

The head-up display 310 and the navigation apparatus 320 are installed in front of the driver's seat in the vehicle interior. An air conditioning duct of the vehicle air conditioning apparatus 4 and the evaporator 5 in the air-conditioning duct are also installed in front of the driver's seat. The heat transfer device 100 includes the heat conductors 7 (71, 72) that couple the composite member 6a (FIG. 1) on a side of the heat generation member 1 with the composite member 6b on a side of the heat radiation member 2, and transfer the heat from the heat generation member 1 to the heat radiation member 2.

Figure 4:
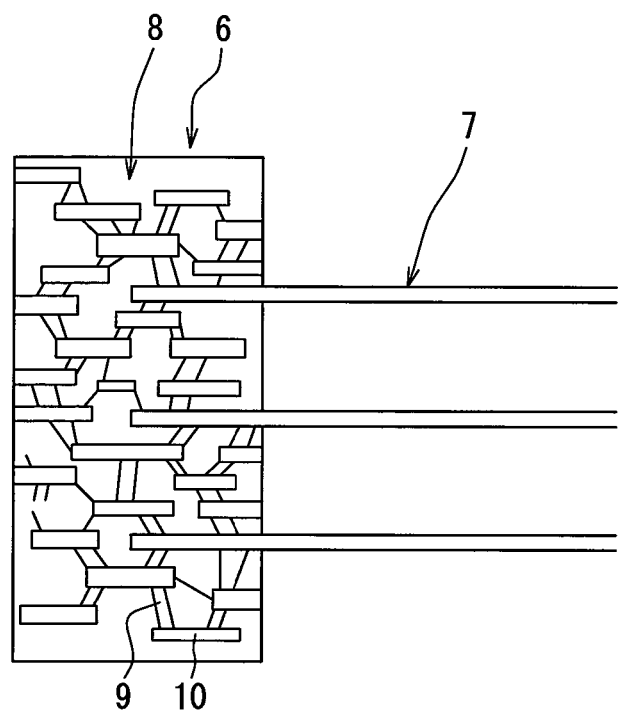
FIG. 4 is a schematic diagram illustrating an internal configuration of a composite member according to the first embodiment.

FIG. 4 schematically illustrates an internal configuration of the composite member 6. The composite member 6 is disclosed in Non-Patent Document 1, and carbon nanotubes 9 and carbon fibers 10 are complexed together in metal including aluminum (or copper) serving as a base material 8. The respective carbon fibers 10 in the composite member 6 are crosslinked with each other by the carbon nanotubes 9. The base material 8 exchanges heat with the heat generation member 1 or the heat radiation member 2. A cross-sectional hatching of the composite member 6 is omitted in FIG. 4.

The carbon nanotubes (CNT) are a material in which carbon atoms are held together in a mesh fashion so as to be cylindrically shaped, and a diameter of the carbon nanotubes is several nanometers. The carbon nanotubes are high in strength, the modulus of elasticity, and flexibility, and have excellent electrical conductivity and thermal conductivity.

The heat conductor 7 has a flexible length of about 50 cm, and one end (end) of the heat conductor 7 is formed of a carbon fiber cable having a carbon fiber group embedded in the composite member 6. One end of the heat conductor 7 is embedded in the composite member 6 with the result that the heat conductor 7 is crosslinked with the carbon fibers 10 in the composite member 6 through the carbon nanotubes 9. The heat conductor 7 is formed of a linear structure extending from one to the other. The heat conductor 7 is made of an aggregate of carbon fibers (carbon fiber group) which are carbon-based material, and is commercially available. The heat conductor 7 may have a length for coupling the heat generation member 1 to the heat radiation member 2 in the vehicle, and the length ranges from 15 cm to 150 cm. The heat conductor 7 thermally couples the heat generation member 1 with the heat radiation member 2, and transfers the heat generated in the heat generation member 1 to the heat radiation member 2.

As illustrated in FIG. 1, the composite member 6 is attached to each of the heat generation member 1 and the heat radiation member 2 by a fixing member 12 forming a connector and made of a synthetic resin. As a result, the composite member 6 is pressed directly or indirectly against the surface of the heat generation member 1 and the surface of the heat radiation member 2.

In an instrument panel of the vehicle, in the summer, the navigation apparatus 320, the head-up display 310, and LEDs (light emitting diodes) not shown generate heat, and become high in temperature. For that reason, those devices fail, or do not operate properly without radiation (cooling). Hence, in general, a heat sink, a radiation fin, a blower, and a heat pipe are required.

However, in the future, because the electronic devices mounted in the vehicle are downsized, a heat density increases. In addition, the number of electronic devices tends to increase, and if a heat radiation equipment having the heat sink, the radiation fin, and the blower is provided in each of those electronic devices, the size, the costs, and fan noise are increased as a whole.

In addition, because the air conditioning duct of the vehicle air conditioning apparatus 4 is mounted separately from the various electronic devices in the vicinity of the instrument panel, when the heat generation member 1 and the heat radiation member 2 are thermally coupled with each other by a rigid body such as the heat pipe, the assembly is difficult. In this regard, in the first embodiment, since the heat conductor 7 is formed of the flexible linear structure extending from one to the other, the assembly is easy. In addition, quietness can be kept without any fan noise.

FIG. 4 is an illustrative view illustrating a coupling structure of the composite member 6 with the heat conductor 7 with the removal of the fixing member 12 made of the synthetic resin. The composite member 6 includes the carbon nanotubes 9 and the carbon fibers 10 which are complexed together in metal (or synthetic resin) serving as the base material 8, and the respective carbon fibers 10 in the base material 8 are crosslinked with each other by the carbon nanotubes 9.

Referring to FIG. 4, the other end not shown of the heat conductor 7 is coupled with a semiconductor device forming the heat generation member 1. One end of the heat conductor 7 is partially embedded into the composite member 6. The heat conductor 7 has a length of about 50 cm, and is configured by bundling millions of flexible carbon fibers (linear carbon).

The composite member 6 includes carbon fibers 10 of 50% and the carbon nanotubes 9 of 0.5% by volume content, which are mixed into aluminum (or copper) serving as the base material 8, and sintered in plasma. The mixed carbon fibers 10 are about 300 μm in length and 7 μm in diameter.

As illustrated in FIG. 4, one end of the heat conductor 7 is partially embedded into the composite member 6. However, because the carbon fibers 10 are about 300 μm in length, it is preferable that the heat conductor 7 is embedded into the composite member 6 with a length of five times or more as long as 300 μm (more preferably ten times or more).

As illustrated in FIG. 1, a semiconductor device 1a forming the heat generation member 1 and the heat generation side composite member 6a are thermally coupled with each other by an interface substance 13 (13a, 13b). The interface substance 13 is configured to correct the unevenness of surface roughness of the composite member 6 and the semiconductor device 1a to reduce a thermal resistance. The interface substance 13 is made of a thin resilient rubber into which the carbon nanotubes and the carbon fibers are mixed, or grease. The interface substance 13 is not essential.

One end of the carbon fiber cable configuring the heat conductor 7 passes through the composite member 6b, and is thermally coupled with a metal surface of the evaporator 5 in the vehicle air conditioning apparatus 4 through the interface substance 13b. The vehicle air conditioning apparatus 4 has the evaporator 5 made of an aluminum alloy in the air conditioning duct. The evaporator 5 is cooled by internally evaporating refrigerant configuring a refrigeration cycle of the vehicle air conditioning apparatus 4.

The fixing member 12 (12a, 12b) surrounding the composite member 6 presses the composite member 6 (6a, 6b) against the heat generation member 1 or the heat radiation member 2 through the interface substance 13 (13a, 13b). The fixing member 12 is attached to a resin member or a metal member in which the semiconductor device 1a is implemented by a claw portion 14 (14a, 14b), and the claw portion 14 and the fixing member 12 are an integrally molded product made of synthetic resin.

As described above, the fixing member 12 has the claw portion 14, and can be fixed to the circuit board 16 made of the resin member or the heat sink made of the metal member by one touch operation, and can be prevented from being removed. A coupling part of the evaporator 5 and the fixing member 12b easily absorbs the heat in the vicinity of an inflow portion in which the refrigerant flows or in a portion where a liquid refrigerant is rich and a temperature is low.

Hereinafter, the effects of the first embodiment will be described. In the above first embodiment, the heat transfer device 100 couples the heat generation member 1 with the heat radiation member 2, and transfers the heat from the heat generation member 1 to the heat radiation member 2. The heat transfer device 100 includes the composite member 6 and the heat conductor 7. The composite member 6 includes the multiple carbon nanotubes 9 and the multiple carbon fibers 10 which are mixed into the base material 8 and complexed together, and the respective carbon fibers 10 are crosslinked with each other by the carbon nanotubes 9. One end of the heat conductor 7 having the flexibility is embedded into the composite member 6, and the embedded one end is crosslinked with the carbon fibers 10 in the composite member 6 through the carbon nanotubes 9.

According to the above configuration, the heat conductor 7 has one flexible end embedded in the composite member 6. The embedded one end is crosslinked with the carbon fibers 10 in the composite member 6 by the carbon nanotubes 9. Hence, the heat transfer between the heat conductor 7 and the composite member 6 is excellent. Therefore, the heat transfer device 100 in which the heat transfer characteristic between the heat generation member 1 and the heat radiation member 2 is excellent, and the heat generation member 1 and the heat radiation member 2 can be easily coupled with each other by the flexible heat conductor 7 can be provided.

The heat conductor 7 is formed of the carbon fiber cable made of a carbon-based material. Therefore, one end of the flexible heat conductor 7 is embedded in the composite member 6. The embedded one end of the heat conductor 7 is crosslinked with the carbon fibers 10 in the composite member 6 through the carbon nanotubes 9. In order to obtain the excellent heat transfer characteristic by crosslinking with the carbon fibers 10 in the composite member 6, the carbon fiber cable of the same carbon-based material is preferable.

Further, the base material 8 of the composite member 6 includes aluminum or copper. Therefore, since aluminum or copper is used as the base material 8 in which the carbon nanotubes 9 and the carbon fibers 10 are complexed with each other, and the respective carbon fibers 10 are crosslinked with each other by the carbon nanotubes 9, the thermal conductivity is excellent.

In addition, the composite member 6 includes the one-side composite member 6a disposed on one side of the heat conductor 7, and the other side composite member 6b disposed on the other side of the heat conductor 7. One end of one side of the heat conductor 7 is embedded into the one side composite member 6a, and one end of the other side of the heat conductor 7 is embedded into the other side composite member 6b.

According to the above configuration, since the composite member 6 includes the one side composite member 6a disposed on one side of the heat conductor 7 and the other side composite member 6b disposed on the other side of the heat conductor 7, one end of one side of the flexible heat conductor 7 is embedded into the one side composite member 6a. In addition, the other end of the heat conductor 7 is embedded into the other side composite member 6b. Since the embedded heat conductor 7 is crosslinked with the carbon fibers 10 in the respective composite members 6a and 6b through the carbon nanotubes 9, the heat conductor 7 can efficiently transfer the heat from one to the other.

The composite member 6 is fitted to the heat generation member 1 or the heat radiation member 2 by the fixing member 12, and the base material 8 is pressed directly or indirectly against the surface of the heat generation member 1 or the surface of the heat radiation member 2. According to the above configuration, the heat transfer between the heat conductor 7 and the heat generation member 1 or the heat radiation member 2 is excellent.

The fixing member 12 is configured as a connector in which the composite member 6 is housed internally, the heat conductor 7 is derived from the surface of the fixing member 12, and the claw portion 14 to be coupled with the heat generation member 1 or the heat radiation member 2 is provided. Therefore, the heat conductor 7 is easily attached to the heat generation member 1 or the heat radiation member 2.

The heat generation member 1 is configured by the electronic device 3 in the vehicle, and the heat radiation member 2 is configured by the evaporator 5 of the vehicle air conditioning apparatus 4 in the vehicle. Therefore, cold of the evaporator 5 which is cooled by the refrigerant is transferred to the electronic device 3, and can cool the electronic device 3.

The single heat radiation member 2 is provided for the multiple heat generation members 1, each of the heat generation members 1 is coupled with the heat radiation member 2 by the multiple composite members 6 and the multiple heat conductors 7, and the heat from the multiple heat generation members 1 is transferred to the single heat radiation member 2. In other words, the heat conductor 7 can concentrate the radiation of the heat from the multiple heat generation members 1 on the single heat radiation member 2.

Second Embodiment

Figure 5:
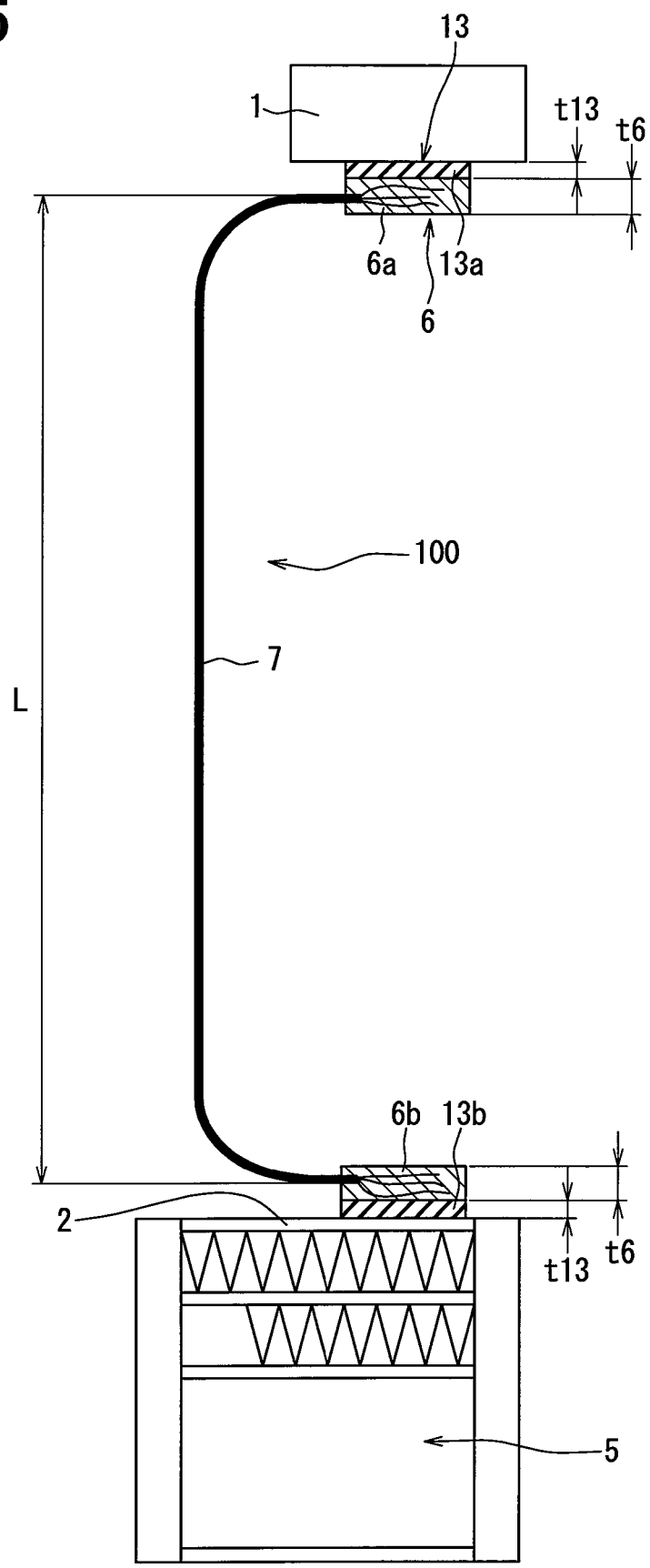
FIG. 5 is a schematic diagram illustrating a heat transfer device according to a second embodiment of the present disclosure.

Next, a second embodiment of the present disclosure will be described. In the following respective embodiments, the same components as those in the above-mentioned first embodiment are denoted by identical reference numerals, and will be omitted from a description, and different configurations will be described. Incidentally, in the second and subsequent embodiments, the same reference numerals as those in the first embodiment denote identical configurations, and a preceding description is incorporated. FIG. 5 illustrates a schematic configuration of a heat transfer device according to a second embodiment of the present disclosure.

An evaporator 5 in a vehicle air conditioning apparatus configures a heat radiation member 2 for a heat generation member 1. The heat generation member 1 is, for example, formed of a semiconductor device in a head-up display 310 (FIG. 3 described in the first embodiment) disposed inside of an instrument panel. The heat generation member 1 and the heat radiation member 2 are coupled with each other by a composite member 6 (6a, 6b) and a heat conductor 7 to transfer heat from the heat generation member 1 to the heat radiation member 2.

The heat generation member 1 may be formed of a semiconductor device in the navigation apparatus 320. The navigation apparatus 320 is installed in front of the driver's seat in the vehicle interior. An air conditioning duct of the vehicle air conditioning apparatus 4 and the evaporator 5 in the air-conditioning duct are also installed in front of the driver's seat.

The composite member 6 is configured by complexing carbon nanotubes and carbon fibers in metal serving as a base material. The respective carbon fibers in the composite member are crosslinked with each other by the carbon nanotubes. The base material in the composite member 6 comes in contact with the heat generation member 1 and the heat radiation member 2 through an interface substance 13 (13a, 13b), and includes aluminum or copper. A thickness t6 of the composite member 6 is 10 mm, and a thickness t13 of the interface substance 13 is 1 mm.

The heat conductor 7 is made of a material that has a flexible length L of about 50 cm, and one end embedded in the composite member 6 (6a, 6b). With the embedded one end, the heat conductor 7 is crosslinked with the carbon fibers in the composite member 6 through the carbon nanotubes 9. The heat conductor 7 is formed of a linear structure extending from one to the other. The heat conductor is formed of a carbon fiber cable made of a carbon-based material.

The composite member 6 is attached to each of the heat generation member 1 and the heat radiation member 2. As a result, the base material 8 is pressed directly or indirectly against a surface of the heat generation member 1 and a surface of the heat radiation member 2. Since the heat conductor 7 is formed of a flexible linear structure extending from one to the other, the assembly is easy.

The composite member 6 (6a, 6b) includes the multiple carbon nanotubes 9 and the carbon fibers 10 which are complexed in aluminum or copper as the base material 8, and the respective carbon fibers 10 are crosslinked with each other by the carbon nanotubes 9, similar to the example illustrated in FIG. 4 explained in the first embodiment.

The composite member 6 has aluminum or copper as the base material 8, and includes the carbon fibers 10 of 50% and the carbon nanotubes 9 of 0.5% by volume content, which are mixed into the base material 8, and sintered in plasma. The mixed carbon fibers are about 300 μm in length and 7 μm in diameter.

Heat is transferred to the semiconductor device forming the heat generation member 1 and the composite member 6 through the interface substance 13 (FIG. 5). The interface substance 13 corrects the unevenness of surface roughness of the composite member 6 and the semiconductor device to reduce a thermal resistance. The interface substance 13 is made of a thin resilient rubber into which the carbon nanotubes and the carbon fibers are mixed, or grease.

FIG. 6 is a table showing a characteristic value of each position illustrated in FIG. 5 according to the second embodiment, and a heat transfer amount based on the characteristic value. In the second embodiment, a thermal conductivity $\lambda 6$ of the composite member 6 is approximately 1000 W/mK at a maximum (watts/meter*Kelvin in unit). The thickness t of the composite member 6=10 mm, and a heat transfer area A6=10 mm×10 mm=100 mm$^2$ are satisfied.

The flexible heat conductor 7 coupled with the composite member 6 is extremely small in thermal resistance, and is equal to or more than the composite member 6 in thermal conductivity. It is assumed that a thermal conductivity $\lambda 7$ of the thermal conductor 7 is 1500 W/mK, a length is 0.5 m, a diameter φ of each carbon fiber of the carbon fiber cable is 7 μm, and the number of carbon fiber cables configuring one heat conductor 7 is 100 million. Further, a cross-sectional area A7 of the heat conductor 7 is 38.5 mm$^2$. As described above, since the heat conductor 7 is formed of a bundle of carbon fibers, and heat in the heat conductor 7 is well transferred in a coupling direction of carbon atoms, there is no need to insulate the periphery of the heat conductor 7.

A thermal conductivity $\lambda 13$ of the interface substance 13 (13a, 13b)=50 W/mK is satisfied. It is assumed that a thickness of the interface substance 13 is 1 mm, and a cross-sectional area A=10 mm×10 mm=100 mm$^2$. In addition, it is assumed that a surface temperature Ti of the semiconductor device of the electronic device such as the navigation apparatus 320 is 85° C. (equivalent to a guarantee maximum temperature of the electronic device), and a surface temperature To of the evaporator 5 is 5° C.

According to the above configuration, when the heat transfer is calculated by using a basic formula of heat transfer shown in FIG. 6, the heat of approximately 9 W (watts) can be transferred from the semiconductor device to the evaporator 5. Since the amount of heat generation in a general electronic device is about several W, a heat transfer amount is sufficiently satisfied. Incidentally, if the heat transfer amount is insufficient, the heat transfer amount can be covered by a heat sink, a radiation fan, and a coolant on the electronic device side.

A cross-section of the composite member 6 is rectangular with two pairs of sides facing each other, and one end of the heat conductor 7 is embedded into the composite member 6 from any side (short side) of a shorter one of the two pairs of sides. The carbon fiber cable formed of the carbon fiber group configuring the heat conductor 7 in the composite member 6 is loosened and branched into multiple pieces.

Hereinafter, the effects of the second embodiment will be described. In the above second embodiment, the heat transfer device 100 couples the heat generation member 1 with the heat radiation member 2, and transfers the heat from the heat generation member 1 to the heat radiation member 2. The heat transfer device 100 includes the composite member 6 and the heat conductor 7. The composite member 6 includes the multiple carbon nanotubes 9 and the multiple carbon fibers 10 which are mixed into the base material 8 and complexed together, and the respective carbon fibers 10 are crosslinked with each other by the carbon nanotubes 9. The heat conductor 7 has the flexibility and one end embedded in the composite member 6. The embedded one end is crosslinked with the carbon fibers 10 in the composite member 6 through the carbon nanotubes 9.

According to the above configuration, one end of the heat conductor 7 having the flexibility is embedded into the composite member 6, and the embedded one end of the heat conductor 7 is crosslinked with the carbon fibers 10 in the composite member 6 through the carbon nanotubes 9. Hence, the heat transfer between the heat conductor 7 and the composite member 6 is excellent. Therefore, the heat transfer device 100 in which the heat transfer characteristic between the heat generation member 1 and the heat radiation member 2 can be also improved, and the heat generation member 1 and the heat radiation member 2 can be easily coupled with each other by the flexible heat conductor 7 can be provided.

The heat conductor 7 is formed of the carbon fiber cable made of a carbon-based material. One end of the flexible heat conductor 7 is embedded in the composite member 6. The embedded one end of the heat conductor 7 is crosslinked with the carbon fibers 10 in the composite member 6 through the carbon nanotubes 9. In order to obtain the excellent heat transfer characteristic by crosslinking with the carbon fibers 10 in the composite member 6, the carbon fiber cable of the same carbon-based material is preferable.

Further, the base material 8 of the composite member 6 includes aluminum or copper. Therefore, the thermal conductivity is excellent. In addition, the composite member 6 includes the one-side composite member 6a disposed on one side of the heat conductor 7, and the other side composite member 6b disposed on the other side of the heat conductor 7. One end of one side of the heat conductor 7 is embedded into the one side composite member 6a, and one end of the other side of the heat conductor 7 is embedded into the other side composite member 6b.

According to the above configuration, since the composite member 6 includes the one side composite member 6a disposed on one side of the heat conductor 7 and the other side composite member 6b disposed on the other side of the heat conductor 7, one end of one side of the flexible heat conductor 7 is embedded into the one side composite member 6a. In addition, the other end of the heat conductor 7 is embedded into the other side composite member 6b. Since the embedded heat conductor 7 is crosslinked with the carbon fibers 10 in the respective composite members 6a and 6b through the carbon nanotubes 9, the heat conductor 7 can efficiently transfer the heat from one to the other.

As illustrated in FIG. 5, the composite member 6 is rectangular in cross-section, and one end of the heat conductor 7 is embedded into the composite member 6 from a shorter side of facing sides of the rectangle. Therefore, an embedded depth can be lengthened. The heat conductor 7 includes a group of multiple carbon fibers, and the carbon fiber cable is loosened and branched into multiple pieces in the composite member 6. When the carbon fiber cable is branched as described above, the carbon fiber cable forming the heat conductor 7 and the carbon fibers 10 of the composite member 6 are more complexly crosslinked with each other through the carbon nanotubes 9 to improve the heat transfer characteristic.

Third Embodiment

Next, a third embodiment of the present disclosure will be described. Portions different from those in the above embodiments will be described. FIG. 7 illustrates a schematic configuration of a connector on an electronic device side according to a third embodiment of the present disclosure. Referring to FIG. 7, a fixing member 12 configuring an outer shell of a connector internally houses a composite member 6, and a heat conductor 7 is led from a surface of the fixing member 12. A claw portion 14 coupled with a circuit board 16 of a semiconductor device 1a configuring a heat generation member 1 is provided on the fixing member 12.

The fixing member 12 is coupled with the circuit board 16 by the claw portion 14, and the composite member 6 having a base material 8 is pressed against a surface of the semiconductor device 1a configuring the heat generation member 1 through the interface substance 13. An electric heating element (for example, PTC) 23 that is energized by a battery 22 by turning on a switch 21 to generate heat is disposed inside of the fixing member 12.

At a low temperature, the electric heating element 23 is energized, and the heat generation member 1 formed of the semiconductor device 1a in the electronic device is controlled in a predetermined temperature range. The electric heating element 23 is available as a space heater, and also serves to prevent harmful condensation from being generated in the electronic device due to a lower temperature of the fixing member 12 configuring the outer shell of the connector. The heat generation member 1 may be replaced with the heat radiation member 2. The fixing member 12 may be attached by a screw instead of the claw portion 14. Further, the circuit board 16 may be replaced with a heat sink.

Hereinafter, the effects of the third embodiment will be described. In the above third embodiment, the composite member 6 is fitted to the heat generation member 1 or the heat radiation member 2 by the fixing member 12, and the base material 8 is pressed directly or indirectly against the surface of the heat generation member 1 or the surface of the heat radiation member 2. According to the above configuration, the heat transfer between the heat conductor 7 and the heat generation member 1 or the heat radiation member 2 is excellent.

The fixing member 12 is configured as a connector in which the composite member 6 is housed inside of a closed space, the heat conductor 7 is derived from the surface of the fixing member 12, and a fastener formed of the claw portion 14 (or screw) to be coupled with the heat generation member 1 or the heat radiation member 2 is provided. Therefore, the heat conductor 7 can be easily attached to the heat generation member 1 or the heat radiation member 2.

The heat generation member 1 is configured by the electronic device 3 in the vehicle, and the heat radiation member 2 is configured by the evaporator 5 of the vehicle air conditioning apparatus 4 in the vehicle. Therefore, cold of the evaporator 5 which is cooled by the refrigerant is transferred to the electronic device 3, and can cool the electronic device 3.

The electric heating element 23 that is energized by the battery 22 by turning on the switch 21 to generate heat is disposed inside of the fixing member 12. Therefore, when a temperature of the heat generation member 1 is too low, the heat generation member 1 is heated by the electric heating element 23 to enable a temperature adjustment, and the electronic device 3 can be actuated in a preferable temperature range.

Fourth Embodiment

Figure 8:
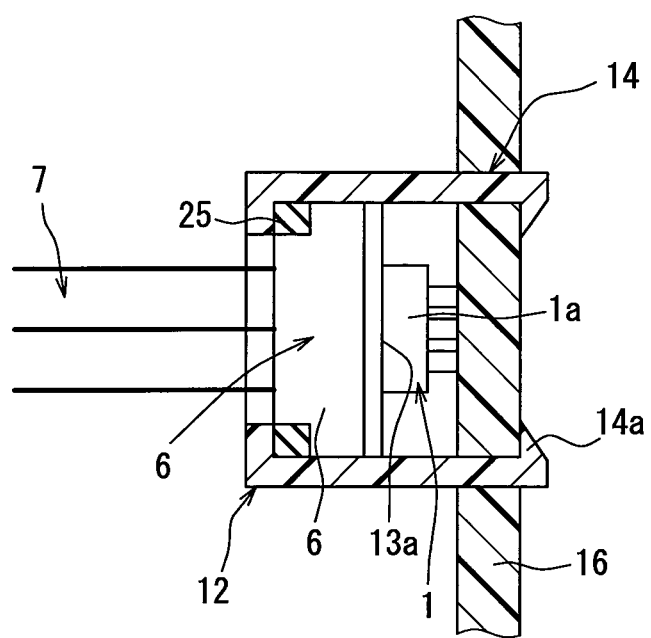
FIG. 8 is a schematic view illustrating a connector according to a fourth embodiment of the present disclosure.

Next, a fourth embodiment of the present disclosure will be described. Portions different from those in the above embodiments will be described. FIG. 8 illustrates a schematic configuration of a connector according to a fourth embodiment of the present disclosure. Referring to FIG. 8, a fixing member 12 internally houses a composite member 6, and a heat conductor 7 is led from a surface of the fixing member 12. The fixing member 12 is configured as an outer shell of a connector having a claw portion 14 to be coupled with a heat generation member 1. A composite member 6 is pressed against a surface of the heat generation member 1 through an interface substance 13a by the claw portion 14. The claw portion 14 may be replaced with a screw.

A ring-shaped elastic member 25 is disposed in the fixing member 12, and the elastic member 25 is compressed when the claw portion 14 is locked by a circuit board 16. The composite member 6 is pressed directly or indirectly against a surface of the heat generation member 1 by the aid of a resilient force by which the elastic member 25 is to return to an original position. Even when the composite member is pressed against the surface of the heat radiation member 2, an equivalent of the elastic member 25 is available. The elastic member may be configured by a metal spring instead of the ring-shaped rubber.

Hereinafter, the effects of the fourth embodiment will be described. In the above fourth embodiment, the composite member 6 is fitted to the heat generation member 1 or the heat radiation member 2 by the fixing member 12, and the composite member 6 is pressed directly or indirectly against the surface of the heat generation member 1 or the surface of the heat radiation member 2. According to the above configuration, the heat transfer between the heat conductor 7 and the heat generation member 1 or the heat radiation member 2 is excellent.

The fixing member 12 is configured as a connector in which the composite member 6 is housed internally, the heat conductor 7 is derived from the surface of the fixing member 12, and a fastener formed of the claw portion 14 or the screw to be coupled with the heat generation member 1 or the heat radiation member 2 is provided. Therefore, the heat conductor 7 can be easily attached to the heat generation member 1 or the heat radiation member 2.

Further, the elastic member 25 that is compressed in a state where the connector is coupled with the heat generation member 1 or the heat radiation member 2 by the aid of the claw portion 14 or the screw, and presses the composite member 6 directly or indirectly against the surface of the heat generation member 1 or the surface of the heat radiation member 2 is disposed in the fixing member 12. Therefore, the composite member 6 can be further firmly pressed against the heat generation member or the heat radiation member with the resilient force of the elastic member 25 in addition to pressing by the claw portion 14 or the screw, and the heat transfer is improved.

Fifth Embodiment

Figure 9:
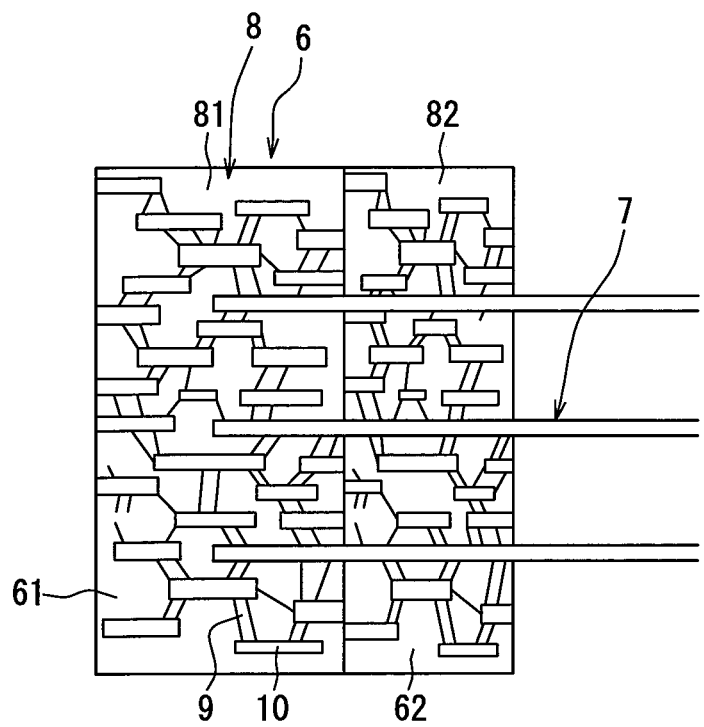
FIG. 9 is a schematic view illustrating a coupling structure of a composite member and a heat conductor according to a fifth embodiment of the present disclosure.

Next, a fifth embodiment of the present disclosure will be described. Portions different from those in the above embodiments will be described. FIG. 9 illustrates a coupling structure of a composite member 6 (61, 62) with a heat conductor 7 with the removal of a fixing member 12 made of a synthetic resin in a connector.

In the fifth embodiment, the composite member 6 includes a first composite portion 61 and a second composite portion 62. In the first composite portion 61, carbon nanotubes 9 and carbon fibers 10 are complexed in metal serving as a first base material 81, and the respective carbon fibers 10 are crosslinked with each other by the carbon nanotubes 9.

In the second composite portion 62 that comes in close contact with the first composite portion 61, the carbon nanotubes 9 and the carbon fibers 10 are complexed together in a synthetic resin or rubber serving as a second base material 82. The respective carbon fibers 10 in the second base material 82 made of a synthetic resin or rubber are crosslinked with each other by the carbon nanotubes 9.

The other end not shown of the heat conductor 7 (right in FIG. 9) is coupled with a semiconductor device forming the heat generation member 1. One end of the heat conductor 7 is partially embedded in the first composite portion 61, and penetrates through the second composite portion 62. The heat conductor 7 has a length of about 50 cm, and is configured by bundling millions of flexible carbon fibers. The carbon fiber cable may be replaced with a sheet-like graphite which will be described later.

Hereinafter, the effects of the fifth embodiment will be described. In the above first embodiment, the heat transfer device 100 couples the heat generation member 1 with the heat radiation member 2, and transfers the heat from the heat generation member 1 to the heat radiation member 2. The heat transfer device 100 includes the composite member 6 and the heat conductor 7. The composite member 6 includes the multiple carbon nanotubes 9 and the multiple carbon fibers 10 which are mixed into the base material 8 (81, 82) and complexed together, and the respective carbon fibers 10 are crosslinked with each other by the carbon nanotubes 9. One end of the heat conductor 7 having the flexibility is embedded into the composite member 6, and the embedded one end is crosslinked with the carbon fibers 10 in the composite member 6 through the carbon nanotubes 9.

According to the above configuration, the heat conductor 7 has the flexible one end embedded in the composite member 6. Since the embedded one end is crosslinked with the carbon fibers 10 in the composite member 6 by the carbon nanotubes 9, the heat transfer between the heat conductor 7 and the composite member 6 is excellent. Therefore, the heat transfer device in which the heat transfer characteristic between the heat generation member 1 and the heat radiation member 2 is excellent, and the heat generation member 1 and the heat radiation member 2 can be easily coupled with each other by the flexible heat conductor 7 can be provided.

The heat conductor 7 is formed of the carbon fiber cable or the sheet-like graphite made of a carbon-based material. One end of the flexible heat conductor 7 is embedded in the composite member 6. The embedded one end of the heat conductor 7 is crosslinked with the carbon fibers 10 in the composite member 6 through the carbon nanotubes 9. In order to obtain the excellent heat transfer characteristic by crosslinking with the carbon fibers 10 in the composite member 6, the carbon fiber cable or the sheet-like graphite which is the same carbon-based material is preferable.

The composite member 6 includes the first composite portion 61, and the second composite portion 62 adjacent to the first composite portion 61. The base material 8 includes the first base material 81 in the first composite portion 61, and the second base material 82 in the second composite portion 62. The first base material 81 includes aluminum or copper, and is pressed directly or indirectly against the heat generation member 1 or the heat radiation member 2, and one end of the heat conductor 7 is embedded in the first base material 81. The second base material 82 comes in contact with the first base material 81, the heat conductor 7 passes through the second base material 82, and the second base material 82 includes a synthetic resin or rubber.

In other words, the first base material 81 in the base material 8 includes aluminum or copper, and is pressed directly or indirectly against the heat generation member 1 or the heat radiation member 2. The second base material 82 in the base material 8 comes in contact with the first base material 81, the heat conductor 7 passes through the second base material 82, and the second base material 82 includes a synthetic resin or rubber.

According to the above configuration, it is preferable from the viewpoint of thermal conductivity that aluminum or copper is included in the first composite portion 61 of the composite member 6 in which the respective carbon fibers 10 are crosslinked with each other by the carbon nanotubes 9.

In addition, the second composite portion 62 through which the heat conductor 7 passes, and including the second base material 82 made of a synthetic resin or rubber in which the respective carbon fibers 10 are crosslinked with each other through the carbon nanotubes 9 as with the first composite portion 61 is provided. Therefore, a mechanical stress applied to the heat conductor 7 is reduced by the synthetic resin or rubber of the second composite portion 62, and the disconnection of the heat conductor 7 can be suppressed.

The heat generation member 1 is configured by the electronic device 3 in the vehicle, and the heat radiation member 2 is configured by the evaporator 5 of the vehicle air conditioning apparatus 4 in the vehicle, as in the first embodiment. Therefore, cold of the evaporator 5 which is cooled by the refrigerant is transferred to the electronic device 3, and can cool the electronic device 3. A mechanical stress applied to the heat conductor 7 due to vehicle vibration is reduced by the second base material 82 including the synthetic resin or rubber of the second composite portion 62, and the disconnection of the heat conductor 7 can be suppressed.

Sixth Embodiment

Figure 10:
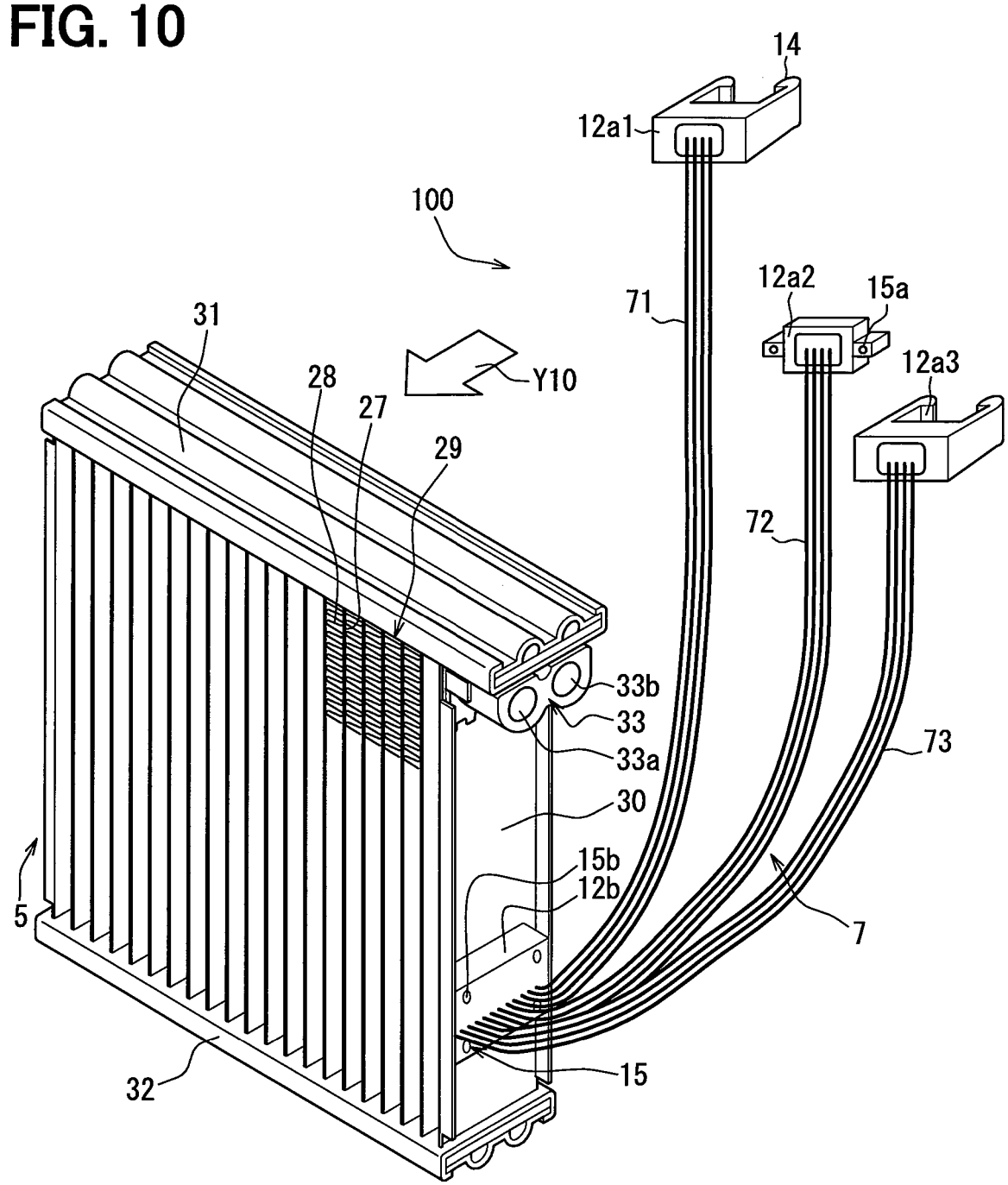
FIG. 10 is a perspective view illustrating a heat transfer device according to a sixth embodiment of the present disclosure.

Next, a sixth embodiment of the present disclosure will be described. Portions different from those in the above embodiments will be described. FIG. 10 illustrates a heat transfer device according to a sixth embodiment of the present disclosure. An evaporator 5 in a vehicle air conditioning apparatus configures a single heat radiation member for multiple heat generation members. Heat generation members include a semiconductor device in a head-up display disposed inside of an instrument panel, a semiconductor device in a navigation apparatus, and a lighting control device for a headlamp.

The heat generation members and a heat radiation member are coupled with each other by multiple heat conductors 71, 72, and 73, and heat from the multiple heat generation members is transferred to an evaporator 5 that is a single heat radiation member. A connector having multiple fixing members 12a1, 12a2, and 12a3 internally includes a composite member. The respective fixing members 12a1 to 12a3 are fitted in the navigation apparatus, the head-up display, and the lighting control device which are heat generation members.

The head-up display, the navigation apparatus, and the light control device are installed in front of the driver's seat in the vehicle interior. An air conditioning duct of the vehicle air conditioning apparatus and the evaporator 5 in the air-conditioning duct are also installed in front of the driver's seat. Therefore, the heat conductors 71 to 73 can be relatively short.

The heat conductors 71 to 73 couple the multiple composite members on the heat generation member side with the single composite member on the radiation member side, and transfer the heat from the heat generation member to the heat radiation member. The composite members are attached to the heat generation members and the heat radiation member by the fixing members 12a1 to 12a3 each forming the connector and made of the synthetic resin.

The fixing members 12a1 to 12a3 are shaped to press the composite members in the respective fixing members 12a1 to 12a3 directly or indirectly against the heat generation member 1, and to be attached to the circuit board or the heat sink, and form an integrally molded product made of a synthetic resin.

The fixing members 12a1 to 12a3 are structured to each provide a claw portion 14 or a screw 15 (15a, 15b), and to be fixable to the circuit board or the heat sink. A fixing member 12b that is a coupling part of the evaporator 5 with the composite members is attached to a portion in which liquid refrigerant accumulates by screws 15b.

The evaporator 5 is disposed in such a manner that multiple tubes 27 each having a flat cross-sectional shape and made of aluminum or aluminum alloy are arrayed in a direction substantially orthogonal to a flow of an arrow Y10 of air serving as a heat exchange fluid. Fins 28 are interposed between the respective tubes 27, and a core 29 is formed by the tubes 27 and the fins 28. Both side surfaces of the core 29 are covered with side plates 30. The fixing member 12b is fastened to the side plates 30 made of aluminum or aluminum alloy by the screws 15b.

An upper tank unit 31 is disposed in an upper part of the tubes 27, and a lower tank unit 32 is disposed in a lower part of the tubes 27. The refrigerant introduced from a refrigerant inlet 33a of a coupling part 33 flows upward or downward in the tubes 27, and flows out from a refrigerant outlet 33b of the coupling part 33.

Hereinafter, the effects of the sixth embodiment will be described. In the above sixth embodiment, as in the first embodiment, the heat transfer device 100 couples the heat generation member with the heat radiation member, and transfers the heat from the heat generation member to the heat radiation member. The heat transfer device 100 includes the composite members and the heat conductors 7.

The composite members each includes the multiple carbon nanotubes and the multiple carbon fibers which are mixed into the base material, and complexed together, and the respective carbon fibers are crosslinked with each other by the carbon nanotubes.

The flexible one end of each heat conductor 7 is embedded in the composite member 6. The embedded one end is crosslinked with the carbon fibers in the composite members 6 by the carbon nanotubes. The heat conductor 7 is formed of the carbon fiber cable or the sheet-like graphite which extends from one to the other.

According to the above configuration, the embedded one end is crosslinked with the carbon fibers in the composite member 6 by the carbon nanotubes. Hence, the heat transfer between the heat conductor 7 and the composite member 6 is excellent. Therefore, the heat transfer device in which the heat transfer characteristic between the heat generation member and the heat radiation member is excellent, and the heat generation members 1 and the heat radiation member 2 can be easily coupled with each other by the flexible heat conductors 7 can be provided.

The heat conductor 7 is formed of the carbon fiber cable made of a carbon-based material. The embedded one end of each heat conductor 7 is crosslinked with the carbon fibers in the composite member through the carbon nanotubes. In order to obtain the excellent heat transfer characteristic by crosslinking with the carbon fibers in the composite member 6, the carbon fiber cable or the sheet-like graphite which is the same carbon-based material is preferable.

The heat generation member is configured by three different electronic devices in the vehicle, and the heat radiation member is configured by the evaporator 5 that is a heat exchanger in the vehicle air conditioning apparatus in the vehicle. Therefore, cold of the evaporator 5 which is cooled by the refrigerant is transferred to the electronic device, and can cool the electronic device.

Seventh Embodiment

Figure 11:
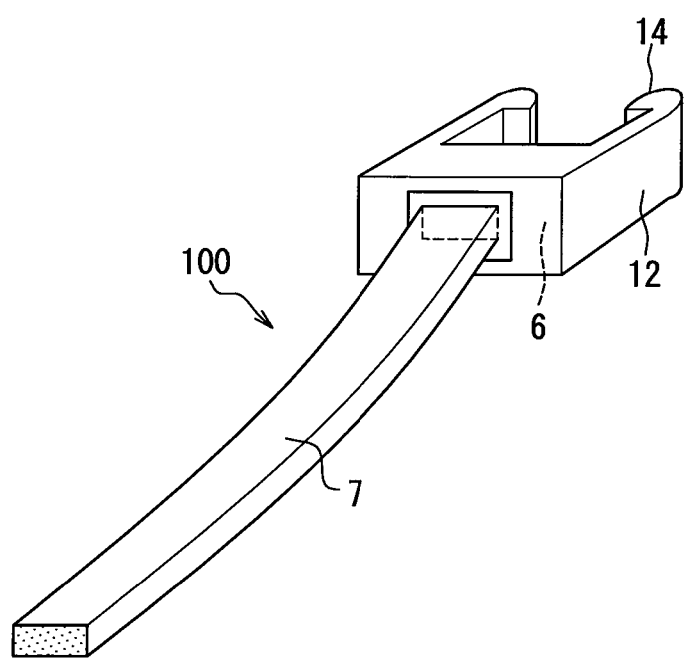
FIG. 11 is a schematic perspective view of a connector on the other side according to a seventh embodiment of the present disclosure.

Next, a seventh embodiment of the present disclosure will be described. Portions different from those in the above embodiments will be described. FIG. 11 illustrates a schematic configuration of a connector on the other side according to a seventh embodiment of the present disclosure. Referring to FIG. 11, a heat conductor 7 is formed of sheet-like graphite graphitized by thermally decomposing a polymer film. Such sheet-like graphite is commercially available, and produced in a method of graphitizing the polymer film by thermal decomposition. Such sheet-like graphite belongs to highly oriented graphite having a structure close to that of monocrystal, which is high in thermal conductivity and flexibility.

Hereinafter, the effects of the seventh embodiment will be described. In the above seventh embodiment, as in the first embodiment, the heat transfer device 100 couples the heat generation member with the heat radiation member, and transfers the heat from the heat generation member to the heat radiation member. The heat transfer device 100 includes the composite members 6 and the heat conductors 7. The composite members 6 each includes the multiple carbon nanotubes and the multiple carbon fibers which are mixed into the base material, and complexed together, and the respective carbon fibers are crosslinked with each other by the carbon nanotubes.

In the heat conductor 7, the one end of the flexible sheet-like graphite is embedded in the composite member 6. The embedded one end is crosslinked with the carbon fibers in the composite member 6 through the carbon nanotubes 9. An embedded depth is the same as that in the above embodiments.

According to the above configuration, since the embedded one end is crosslinked with the carbon fibers in the composite member 6 by the carbon nanotubes, the heat transfer between the heat conductor 7 and the composite member 6 is excellent. Therefore, the heat transfer device in which the heat transfer characteristic between the heat generation member and the heat radiation member is excellent, and the heat generation members 1 and the heat radiation member 2 can be easily coupled with each other by the flexible heat conductors 7 can be provided.

The heat conductor 7 is formed of the sheet-like graphite which is a carbon-based polymer material. One end of the flexible heat conductor 7 is embedded in the composite member 6. The embedded one end of the heat conductor 7 is crosslinked with the carbon fibers in the composite member 6 through the carbon nanotubes. In order to obtain the excellent heat transfer characteristic by crosslinking with the carbon fibers 10 in the composite member 6, the sheet-like graphite which is the same carbon-based polymer material is preferable.

In the above-described embodiment, a preferable embodiment of the present disclosure is described, but the present disclosure is not limited to any of the above-described embodiments, and can be modified and carried out in various manners without departing from the scope of the main idea of the present disclosure. The structures of the embodiment are merely illustrative, and the scope of the present disclosure is not limited to the range of the description of the structures.

A base material of the composite member may be other metal such as aluminum alloy, copper, or copper alloy. The synthetic resin or rubber (for example, fluorine rubber, silicone rubber) may be used as the base material. The heat generation member to be cooled does not need to be the semiconductor device in the electronic device. For example, the heat generation member to be cooled may be a cooling seat for a seat air conditioning apparatus that cools a seat on which an occupant is seated in a vehicle interior, or may be a battery in an electric vehicle or a hybrid vehicle.

In order to increase a heat transfer amount of the heat conductor, there is a need to increase a heat transfer area of the heat conductor. In order to increase the heat transfer area, the number of carbon fibers in the flexible carbon fiber cable may be increased or the stacked number of sheet-like graphite may be increased.

Further, in the above embodiments, the respective composite members are provided on the heat generation member side and the heat radiation member side, and the base materials in those composite members exchange heat with the heat generation member and the heat radiation member. However, a single composite member may be disposed on one of the heat generation member side and the heat radiation member side. In other words, the composite member may be disposed between the end of the heat conductor and at least one of the heat generation member and the heat radiation member, and may exchange heat with at least one of the heat generation member and the heat radiation member. In such a case, an end of the heat conductor in which the composite member is not provided may be exposed to the interior of a fluid such as the refrigerant or the coolant.

In the carbon fiber cable, a large number of carbon fibers do not need to be employed as a single material, but may be configured as a composite material combined with a base material such as synthetic resin.

What is claimed is:

1. A heat transfer device comprising:
an electronic device generating heat;
an evaporator radiating heat;
a cable including carbon fibers, the cable thermally coupling the electronic device with the evaporator, and transferring heat generated in the electronic device to the evaporator; and
a composite member into which an end of the cable is embedded, the composite member being disposed between the end of the cable and at least one of the electronic device and the evaporator, and exchanging heat with the at least one of the electronic device and the evaporator, wherein
the composite member includes a base material that exchanges heat with the at least one of the electronic device and the evaporator, and a plurality of carbon nanotubes and a plurality of carbon fibers which are mixed into the base material and complexed with each other,
the plurality of carbon fibers are crosslinked with each other by the plurality of carbon nanotubes, and
the carbon fibers of the end of the cable are crosslinked with the plurality of carbon fibers in the composite member through the plurality of carbon nanotubes in the composite member.

2. The heat transfer device according to claim 1, wherein the cable includes one of a carbon fiber cable having a carbon fiber group or a sheet-like graphite made of a carbon-based polymer material.

3. The heat transfer device according to claim 1, wherein the composite member includes a heat generation side composite member into which the end of the cable is embedded, and a heat radiation side composite member into which an other end of the cable is embedded, the heat generation side composite member exchanges heat with the electronic device, and the heat radiation side composite member exchanges heat with the evaporator.

4. The heat transfer device according to claim 1, further comprising a holder that fixes the composite member to the at least one of the electronic device and the evaporator, wherein the holder presses the base material directly or indirectly against a surface of the at least one of the electronic device and the evaporator.

5. The heat transfer device according to claim 4, wherein the holder internally houses the composite member, the holder includes a claw portion or a screw which is coupled directly or indirectly with the at least one of the electronic device and the evaporator, and the cable extends from the composite member through the holder.

6. The heat transfer device according to claim 5, further comprising an elastic member housed in the holder, wherein the elastic member is compressed by the holder in a state where the holder is coupled with the electronic device or the evaporator by the claw portion or the screw, and the elastic member presses the base material directly or indirectly against the surface of the at least one of the electronic device and the evaporator.

7. The heat transfer device according to claim 1, wherein the base material of the composite member includes aluminum or copper.

8. The heat transfer device according to claim 7, wherein the composite member includes a first composite portion and a second composite portion adjacent to the first composite portion, the base material includes a first base material in the first composite portion, and a second base material in the second composite portion, the first base material includes the aluminum or the copper, and is pressed directly or indirectly against the at least one of the electronic device and the evaporator, the second base material is in contact with the first base material, and includes a synthetic resin or rubber, and the end of the cable is embedded into the first base material through the second base material.

9. The heat transfer device according to claim 1, wherein the electronic device includes an electronic device in a vehicle, and the evaporator includes an evaporator of a vehicle air conditioning apparatus in the vehicle.

10. The heat transfer device according to claim 1, wherein the electronic device is one of a plurality of electronic devices, the evaporator is a single evaporator, the composite member is one of a plurality of composite members, the cable is one of a plurality of cables, the plurality of electronic devices are coupled with the single evaporator through the plurality of composite members and the plurality of cables, and the plurality of composite members and the plurality of cables transfer heat from the plurality of electronic devices to the single evaporator.

11. The heat transfer device according to claim 1, wherein the composite member has a rectangular cross-section, and the end of the cable is embedded into the composite member from a short side of the rectangular cross-section.

12. The heat transfer device according to claim 1, wherein the cable is branched into a plurality of pieces in the composite member.

13. The heat transfer device according to claim 4, further comprising an electric heating element that is housed inside of the holder, wherein the electric heating element is supplied with electricity from a battery by turning on a switch to generate heat.

14. A heat transfer device comprising:

a seat air conditioner air-conditioning a seat on which an occupant is seated in a vehicle interior and generating heat;

an evaporator radiating heat;

a cable including carbon fibers, the cable thermally coupling the seat air conditioner with the evaporator, and transferring heat generated in the seat air conditioner to the evaporator; and a composite member into which an end of the cable is embedded, the composite member being disposed between the end of the cable and at least one of the seat air conditioner and the evaporator, and exchanging heat with the at least one of the seat air conditioner and the evaporator, wherein the composite member includes a base material that exchanges heat with the at least one of the seat air conditioner and the evaporator, and a plurality of carbon nanotubes and a plurality of carbon fibers which are mixed into the base material and complexed with each other, the plurality of carbon fibers are crosslinked with each other by the plurality of carbon nanotubes, and the carbon fibers of the end of the cable are crosslinked with the plurality of carbon fibers in the composite member through the plurality of carbon nanotubes in the composite member.

15. A heat transfer device comprising:

a battery generating heat;

an evaporator radiating heat;

a cable including carbon fibers, the cable thermally coupling the battery with the evaporator, and transferring heat generated in the battery to the evaporator; and a composite member into which an end of the cable is embedded, the composite member being disposed between the end of the cable and at least one of the battery and the evaporator, and exchanging heat with the at least one of the battery and the evaporator, wherein the composite member includes a base material that exchanges heat with the at least one of the battery and the evaporator, and a plurality of carbon nanotubes and a plurality of carbon fibers which are mixed into the base material and complexed with each other, the plurality of carbon fibers are crosslinked with each other by the plurality of carbon nanotubes, and the carbon fibers of the end of the cable are crosslinked with the plurality of carbon fibers in the composite member through the plurality of carbon nanotubes in the composite member.

16. The heat transfer device according to claim 3, further comprising a first holder housing and fixing the heat generation side composite member to the electronic device, and a second holder housing and fixing the heat radiation side composite member to the evaporator.

17. The heat transfer device according to claim 14, wherein
the composite member includes a heat generation side composite member into which the end of the cable is embedded, and a heat radiation side composite member into which an other end of the cable is embedded,
the heat generation side composite member exchanges heat with the seat air conditioner,
the heat radiation side composite member exchanges heat with the evaporator, and
the heat transfer device further comprising a first holder housing and fixing the heat generation side composite member to the seat air conditioner, and a second holder housing and fixing the heat radiation side composite member to the evaporator.

18. The heat transfer device according to claim 15, wherein
the composite member includes a heat generation side composite member into which the end of the cable is embedded, and a heat radiation side composite member into which an other end of the cable is embedded,
the heat generation side composite member exchanges heat with the battery,
the heat radiation side composite member exchanges heat with the evaporator, and
the heat transfer device further comprising a first holder housing and fixing the heat generation side composite member to the battery, and a second holder housing and fixing the heat radiation side composite member to the evaporator.

19. The heat transfer device according to claim 5, wherein the claw portion or the screw of the holder is engaged with or screwed into a circuit board on which the electronic device is mounted.

* * * * *